(12) United States Patent
Sundstrom et al.

(10) Patent No.: US 8,211,555 B2
(45) Date of Patent: Jul. 3, 2012

(54) COATED CUTTING TOOL FOR MEDIUM-ROUGH TO ROUGH TURNING OF STAINLESS STEELS AND SUPERALLOYS

(75) Inventors: Erik Sundstrom, Fagersta (SE); Stefan Ostlund, Fagersta (SE); Jenni Zackrisson, Fagersta (SE); Carlos Bueno Martinez, Vasteras (SE)

(73) Assignee: Seco Tools AB, Fagersta (SE)

(*) Notice: Subject to any disclaimer, the term of this patent is extended or adjusted under 35 U.S.C. 154(b) by 301 days.

(21) Appl. No.: 12/525,196

(22) PCT Filed: Jan. 30, 2008

(86) PCT No.: PCT/SE2008/000086
§ 371 (c)(1),
(2), (4) Date: Dec. 8, 2009

(87) PCT Pub. No.: WO2008/094105
PCT Pub. Date: Aug. 7, 2008

(65) Prior Publication Data
US 2010/0232892 A1 Sep. 16, 2010

(30) Foreign Application Priority Data

Feb. 1, 2007 (SE) .......... 0700271
Jul. 13, 2007 (SE) .......... 0701703
Sep. 14, 2007 (SE) .......... 0702053

(51) Int. Cl.
*B32B 9/00* (2006.01)

(52) U.S. Cl. .......... 428/698; 51/307; 51/309; 428/697; 428/699; 428/701; 428/702

(58) Field of Classification Search .......... 51/307, 51/309; 428/697, 698, 699, 701, 702, 704
See application file for complete search history.

(56) References Cited

U.S. PATENT DOCUMENTS

| 6,177,178 | B1 * | 1/2001 | Ostlund et al. .......... 51/307 |
| 6,221,479 | B1 * | 4/2001 | Waldenstrom et al. ....... 428/698 |
| 7,985,471 | B2 * | 7/2011 | Zackrisson et al. .......... 428/701 |
| 7,993,742 | B2 * | 8/2011 | Ruppi .......... 51/309 |

FOREIGN PATENT DOCUMENTS

JP 2004-299021 * 10/2004

* cited by examiner

*Primary Examiner* — Archene Turner
(74) *Attorney, Agent, or Firm* — Young & Thompson

(57) ABSTRACT

A cutting tool insert is formed from a cemented carbide body and a coating particularly useful in medium-rough to rough turning of stainless-steels and superalloys. The cemented carbide body is formed from cemented carbide with a composition of 7.0-12.0 wt-% Co, 5.0-11.0 wt-% cubic carbide forming metals from group IVb, Vb and VIb of the periodic table, preferably Ti, Nb and Ta, and balance WC with a 10-30 µm essentially cubic carbide phase free and binder phase enriched surface zone. The coating includes an MTCVD Ti(C,N) as the first layer adjacent the body having a thickness of from >2.5 to 7.0 µm, on top of which an αAl$_2$O$_3$ layer is present, with a thickness of between 2.0 and 5.0 µm, and a total thickness of the coating of between 5.5 and 9.5 µm. The alumina layer has a (006) texture.

20 Claims, 1 Drawing Sheet

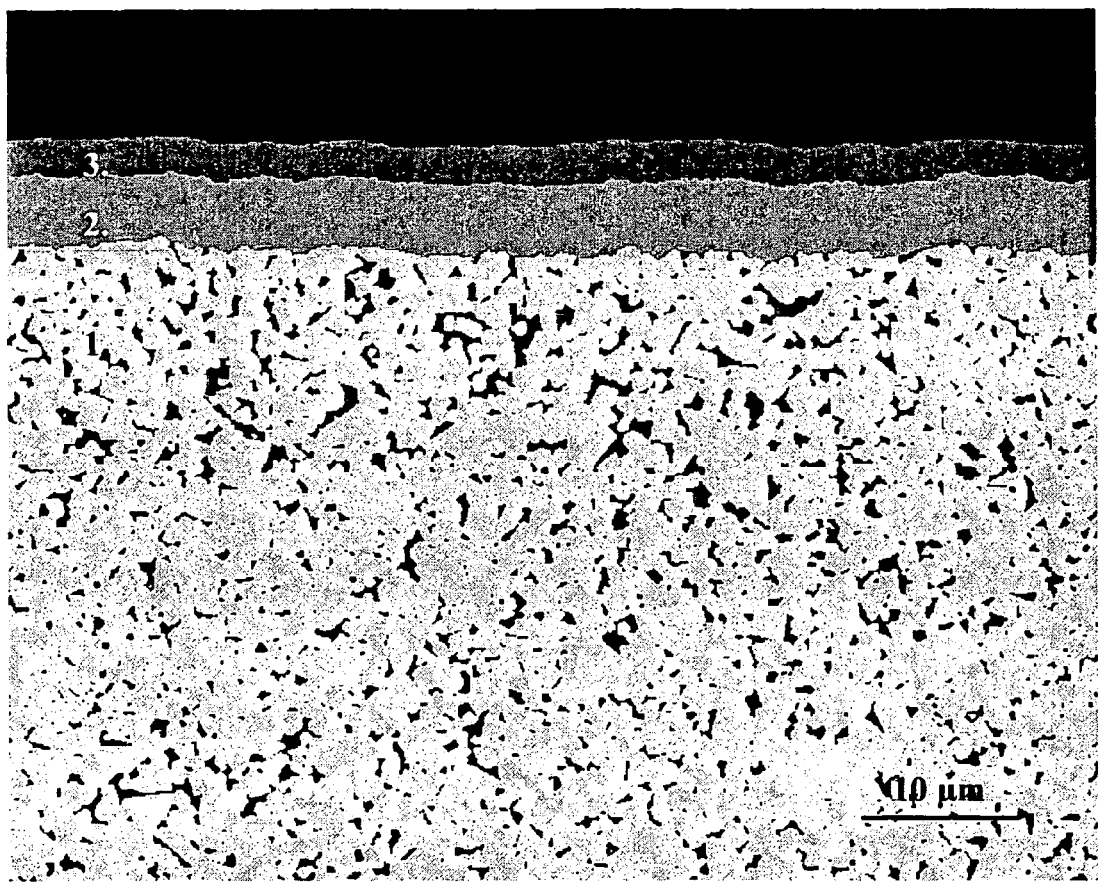

COATED CUTTING TOOL FOR MEDIUM-ROUGH TO ROUGH TURNING OF STAINLESS STEELS AND SUPERALLOYS

BACKGROUND OF THE INVENTION

1. Field of the Invention

The present invention relates to a coated cutting tool insert designed to be used in medium-rough to rough turning stainless steels and super-alloys. The substrate is cemented carbide on which a hard and wear resistant coating is deposited. The coating is composed of one or more refractory layers of which at least one layer is a strongly textured (006) alpha-alumina ($\alpha$-$Al_2O_3$).

2. Description of the Related Art

Steels are said to be stainless when they resist corrosion, or more properly when they are highly resistant to corrosion. The resistance to corrosion is achieved through dissolving sufficient chromium in the iron to produce a coherent, adherent, and regenerating chromium oxide protective film on the surface. A concentration of at least 11 wt-% Cr is required. Most of the stainless steels are based on the Fe—Cr—C and Fe—Cr—Ni—C systems, but other alloying elements are also important.

Stainless steels are used in harsh environments where high corrosion resistance is needed. Some stainless steels are also frequently used at elevated temperatures in severe environments due to their resistance to corrosion and the fact that they maintain their mechanical strength even at elevated temperatures. Stainless steels are among others used in automotive components, for chemical and food processing equipment, for surgical instruments and for cutlery and knives, where both aesthetic appearance and corrosion resistance are important design criteria.

Super-alloys are a broad range of iron, nickel, and cobalt base alloys developed specifically for applications demanding exceptional mechanical and chemical properties at elevated temperatures. The classic use for these alloys is in the hot end of aircraft engines and land based turbines. Almost every metallurgical change made to improve the high temperature properties makes it more difficult to machine these alloys.

As high temperature strength is increased, super-alloys become harder and stiffer at the cutting temperature. It results in increased cutting forces and increased wear on the cutting edge during machining.

Because stronger materials generate more heat during chip formation and because the thermal heat conductivity of these alloys is relatively low, very high cutting temperatures are generated, which also contributes to an increased wear of the cutting edge.

To make matters even worse, as the alloys are heat treated to modify the as cast or solution treated properties, abrasive carbide precipitates or other second phase particles often form. These particles do also cause rapid wear of the cutting edge.

When machining stainless steels and super-alloys, toughness and wear resistance are important properties of the cutting tool. A tougher cutting tool will reduce the risk for chip hammering, chipping and notching. Wear resistance is needed to reduce the risk for plastic deformation, as the temperatures of the cutting edge will be high, a consequence of the poor heat conductivity of stainless steels and super-alloys. The wear resistance will also reduce abrasive wear, which will occur from hard precipitates or inclusions in the work-piece materials as well as from work hardened surfaces created in previous cuts.

SUMMARY OF THE INVENTION

It is an object of the present invention to provide a grade with improved wear resistance and toughness dedicated for medium-rough and rough turning of stainless steels and super-alloys.

It was surprisingly noted that an $\alpha$-$Al_2O_3$ phase coating consisting of nucleated $\alpha$-$Al_2O_3$ with a strong (006) growth texture deposited on a Co-enriched cemented carbide substrate according to this invention gives improved wear resistance and toughness for medium-rough and rough turning of stainless steels and super-alloys.

BRIEF DESCRIPTION OF THE DRAWING FIGURE

FIG. 1 shows a light optical micrograph of a polished surface of a coated cemented carbide substrate according to the present invention in which:
1. Cemented carbide body,
2. Single layer of Ti(C, N) and
3. Single layer of $Al_2O_3$.

DETAILED DESCRIPTION OF THE INVENTION

According to the present invention a coated cutting tool insert is provided consisting of a cemented carbide body with a composition of 7.0-12.0 wt-%, preferably 8.0-11.0 wt-%, most preferably 8.5-9.5 wt-% Co, and 5.0-11.0, preferably 6.5-9.5, wt-% cubic carbide forming metals from groups IVb, Vb and VIb of the periodic table, preferably Ti, Nb and Ta, and balance WC. The ratio between the weight concentrations of Ta and Nb is within 1.0-3.0, preferably 1.5-2.5. The ratio between the weight concentrations of Ti and Nb is within 0.5-1.5, preferably 0.8-1.2 with a coercivity (Hc) of 9.0-14.0, preferably 10.5-12.5 kA/m.

The cemented carbide is provided with a 10-30 µm thick, preferably 15-25 µm thick, essentially cubic carbide phase free and binder phase enriched surface zone with average binder phase content in the range 1.2-2.5 times the nominal binder phase content.

The coating comprises a MTCVD Ti(C,N) as the first layer adjacent the body having a thickness of from 2.5 to 7.0 µm, preferably from 3.5 to 5.0 µm. The MTCVD-layer consists of an innermost TiN layer of <1.0 preferably below 0.5 µm adjacent to the substrate with a Ti(C,N) layer on top. Preferably there is also an additional intermediate TiN layer on top of the Ti(C,N) layer, having a thickness of about 0.3-1.0 µm, preferably 0.5-0.8 µm. On top of the intermediate TiN layer an $\alpha$-$Al_2O_3$ layer is deposited. It is composed of columnar grains with a strong (006) texture. The thickness of the alumina layer is between 2.0 and 5.0 µm, preferably 2.5 and 4.0 µm. The total thickness of the coating comprising the Ti(C, N) and $\alpha$-$Al_2O_3$ layers is between 5.5 and 9.5 µm, preferably 6.5 and 8.5 µm.

The texture coefficients (TC) for the $\alpha$-$Al_2O_3$ layer is determined as follows:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

where
I(hkl)=intensity of the (hkl) reflection,
Io(hkl)=standard intensity according to JCPDS card no 46-1212 and n=number of reflections used in the calculation. (hkl) reflections used are: (012), (104), (110), (006), (113), (202), (024) and (116).

The texture of the alumina layer is as follows: TC(006)> 2.0, preferably larger than 3. Simultaneously, TC(012), TC(110), TC(113), TC(202), TC(024) and TC(116) are all <1 and TC(104) is the second highest texture coefficient. In a preferred embodiment TC(104) is between 0.5 and 2.0.

The (006)-textured α-$Al_2O_3$ layer is the outermost layer and the surface of the α-$Al_2O_3$ is wet-blasted. The surface roughness is Ra=0.5-1.0 μm, preferably 0.5-0.7 μm.

The invention also relates to methods of making cutting tool inserts comprising a cemented carbide substrate consisting of a binder phase of Co, WC and a cubic carbonitride phase with a binder phase enriched surface zone essentially free of cubic phase and a coating. A powder mixture containing 7.0-12.0, preferably 8.0-11.0 wt-%, most preferably 8.5-9.5 wt-% Co, and 5-11, preferably 6.5-9.5, wt-% cubic carbide forming metals from groups IVb, Vb and VIb of the periodic table, preferably Ti, Nb and Ta, and balance WC. The ratio between the weight concentrations of Ta and Nb is within 1.0-3.0, preferably 1.5-2.5. The ratio between the weight concentrations of Ti and Nb is within 0.5-1.5, preferably 0.8-1.2. Well-controlled amounts of nitrogen are added through the powder e.g. as nitrides or by performing an in-situ nitriding in the furnace using e.g. nitrogen gas. The optimum amount of nitrogen to be added depends on the composition of the cemented carbide and in particular on the amount of cubic phases. The exact conditions depend to a certain extent on the design of the sintering equipment being used. It is within the purview of the skilled artisan to determine and to modify the nitrogen addition and the sintering process in accordance with the present specification in order to obtain the desired results.

The raw materials are mixed with pressing agent. The mixture is milled and spray dried to obtain a powder material with the desired properties. Next, the powder material is compacted and sintered. Sintering is performed at a temperature of 1300-1500° C., in a controlled atmosphere of about 50 mbar followed by cooling.

After conventional post sintering treatments including edge honing the cemented carbide surface is coated with a Ti(C,N) layer and possibly intermediate layers by CVD and/or MTCVD. Subsequently, a CVD process incorporating several different deposition steps is used to nucleate α-$Al_2O_3$ at a temperature of 1000° C. In these steps the composition of a $CO_2$+CO+$H_2$+$N_2$ gas mixture is controlled to result in an O-potential required to achieve (006) texture. The α-$Al_2O_3$-layer is then deposited by conventional CVD at 1000° C. The exact conditions depend on the design of the coating equipment being used. It is within the purview of the skilled artisan to determine by experiments the gas mixture in accordance with the present invention.

Finally, the α-$Al_2O_3$-layer is post treated with wet-blasting in order to decrease the surface roughness.

The present invention also relates to the use of inserts according to the above for wet or dry medium-rough and rough turning of stainless steels and super-alloys, at a cutting speed of 25-180 m/min, a cutting depth 0.5-6.5 mm and a feed of 0.15-0.80 mm/rev.

EXAMPLE 1

Cemented carbide inserts were produced according to the invention by conventional milling of the raw material powders, pressing of the green compacts and subsequent sintering at 1430° C. The inserts were also subjected to traditional edge preparation and dimensional grinding. The composition was 9.1 wt % Co, 3.8 wt % TaC, 2.1 wt % NbC, 2.4 wt % TiC and balance WC. The nitrogen was added to the carbide powder as Ti (C, N). The microstructural investigation after sintering showed that a cubic carbide free zone with a thickness of about 20 μm was formed. The coercivity was 11.8 kA/m, corresponding to an average grain size of about 1 μm.

EXAMPLE 2

Inserts from Example 1 were coated by MTCVD. The first layer was Ti(C,N) deposited by MTCVD using acetonitrile as a carbon/nitrogen source. In the following steps an alumina layer was deposited and the composition of $CO_2$+CO+$H_2$+$N_2$ gas mixture was controlled to result in an O-potential required to achieve (006) texture. The thickness of the different layers was controlled by the deposition time. The thickness layer and texture coefficient for the layer is shown in table 1.

TABLE 1

| Thickness and texture coefficients of the layer | | | | | | | | | |
|---|---|---|---|---|---|---|---|---|---|
| TiCN, μm | α-$Al_2O_3$, μm | TC (012) | TC (104) | TC (110) | TC (006) | TC (113) | TC (202) | TC (024) | TC (116) |
| 4.3 | 3.2 | 0.37 | 1.32 | 0.30 | 4.57 | 0.20 | 0.41 | 0.19 | 0.65 |

EXAMPLE 3

Inserts from example 1 and example 2 and a competitor grade (prior art) relevant to the application area were tested with respect to tool-life.

| | |
|---|---|
| Work piece: | Pin |
| Material: | 17.4PH forged, precipitation hardened martensitic stainless steel |
| Insert type: | DNMG150608-M3 |
| Cutting speed: | 180 m/min |
| Feed: | 0.2 mm/rev |
| Depth of cut: | 3.0 mm |
| Remarks: | Coolant |

The tool-life criterion was part size variation. Table 2 shows the number of machined parts per insert.

TABLE 2

| Tool-life | |
|---|---|
| Insert | Machined parts |
| Invention | 40 |
| Competitor 1 | 30 |

EXAMPLE 4

Inserts from example 1 and example 2 and a competitor grade (prior art) relevant to the application area were tested with respect to tool-life.

| | |
|---|---|
| Work piece: | Gate valve body |
| Material: | UNS31803 cast, duplex stainless steel |
| Insert type: | CNMG160612-MR7 |
| Cutting speed: | 120-135 m/min |
| Feed: | 0.55 mm/rev |
| Depth of cut: | 3.0 mm |
| Remarks: | Coolant |

The tool-life criterion was 0.3 mm flank wear. Table 3 shows the number of machined parts per insert.

TABLE 3

| | Tool-life | |
|---|---|---|
| Insert | Machined parts (120 m/min) | Machined parts (135 m/min) |
| Invention | 2 | 3 |
| Competitor 1 | 1 | 1 |

EXAMPLE 5

Inserts from example 1 and example 2 and a competitor grade (prior art) relevant to the application area were tested with respect to tool-life.

| | |
|---|---|
| Work piece: | Gate valve body |
| Material: | S31803 cast, duplex stainless steel |
| Insert type: | SNMM190616-R8 |
| Cutting speed: | 60-80 m/min |
| Feed: | 0.80 mm/rev |
| Depth of cut: | 3.0-4.0 mm |
| Remarks: | Dry |

Table 4 shows the total time in cut at two different cutting data. The tool-life criterion was edge breakage.

TABLE 4

| | Tool-life | |
|---|---|---|
| Insert | Time in cut at 60 m/min [min] | Time in cut at 80 m/min [min] |
| Invention | 17:00 | 12:30 |
| Competitor 1 | 03:50 | 02:15 |

EXAMPLE 6

Inserts from example 1 and example 2 and a competitor grades (prior art) relevant to the application area were tested with respect to tool-life.

| | |
|---|---|
| Work piece: | Block valve |
| Material: | Inconel 625 weld overlay, Super-alloy |
| Insert type: | SNMG150612-MR7 |
| Cutting speed: | 25 m/min |
| Feed: | 0.25 mm/rev |
| Depth of cut: | 1.0-3.0 mm |
| Remarks: | Coolant |

Table 5 shows the machined number of parts per edge. The tool-life criterion was edge breakage.

TABLE 5

| | Tool-life |
|---|---|
| Insert | Number of machined parts |
| Invention | 22 |
| Competitor 1 | 7 |
| Competitor 2 | 10 |

EXAMPLE 7

Inserts from example 1 and example 2 and a competitor grade (prior art) relevant to the application area were tested with respect to tool-life.

| | |
|---|---|
| Work piece: | Nut |
| Material: | AISI316L, hexagonal bar |
| Insert type: | CNMG120408-MF4 |
| Cutting speed: | 100-120 m/min |
| Feed: | 0.2 mm/rev |
| Depth of cut: | 2.0 mm |
| Remarks: | Coolant |

Table 6 shows the machined number of parts per edge. The tool-life criterion was flank wear 0.02 mm.

TABLE 6

| | Tool-life |
|---|---|
| Insert | Number of machined parts |
| Invention | 27 |
| Competitor 1 | 19 |

Examples 3-7 show that the inserts according to the invention offer an increased tool-life and increased productivity.

The invention claimed is:

1. A cutting tool insert comprising a cemented carbide body and a coating for medium-rough to rough turning of stainless-steels and superalloys;
    wherein said cemented carbide body comprises 7.0-11.0 wt-% Co, 5.0-11.0 wt-% cubic carbide forming metals selected from groups IVb, Vb and VIb of the periodic table and balance WC, and with a weight-ratio of Ta and Nb, when present, between 1.0-3.0, and between Ti and Nb, when present, within 0.5-1.5, and with a coercivity (Hc) of 9.0-14.0 kA/m, whereby the cemented carbide is provided with a 10-30 µm, essentially cubic carbide phase free and binder phase enriched surface zone with an average binder phase content in a range 1.2-2.5 times a nominal binder phase content, and
    wherein said coating comprises a MTCVD Ti(C,N) as a first layer adjacent the body having a thickness of from 2.5 to 7.0 µm, where the MTCVD-layer comprises an innermost TiN layer adjacent to the body with a Ti(C,N) layer on top, optionally with an additional intermediate TiN layer on top of the Ti(C,N) layer, with a thickness of 0.3-1.0 μm, on top of which an α-Al$_2$O$_3$ layer is present, with a thickness of between 2.0 and 5.0 μm, and a total thickness of the coating between 5.5 and 9.5 μm, where a texture of the α-Al$_2$O$_3$ layer is TC(006)>2.0, and where texture coefficients (TC) for the α-Al$_2$O$_3$ layer is determined as follows:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

where

I(hkl)=intensity of the (hkl) reflection,

I$_0$(hkl)=standard intensity according to JCPDS card no 46-1212, and n=number of reflections used in the calculation, and the (hkl) reflections used are: (012), (104), (110), (006), (113), (202), (024) and (116), where TC(012), TC(110), TC(113), TC(202), TC(024) and TC(116) are all simultaneously <1 and TC(104) is the second highest texture coefficient with TC(104) between 0.5 and 2.0.

2. The cutting tool insert according to claim 1, wherein a surface of the α-Al$_2$O$_3$ layer is wet-blasted, with roughness R$_a$=0.5-1.0 μm.

3. A method for making a cutting tool insert for medium-rough to rough turning of stainless steels and superalloys, comprising a cemented carbide body and a coating, comprising the steps of:

providing a substrate made by powder metallurgical methods milling, pressing and sintering with a cemented carbide substrate with a composition of 7.0-12.0 wt-% Co, 5.0-11.0 wt-% cubic carbide forming metals selected from groups IVb, Vb and VIb of the periodic table and balance WC, and with a weight-ratio of Ta and Nb, when present, between 1.0-3.0 and between Ti and Nb, when present, within 0.5-1.5 and with a coercivity (Hc) of 9.0-14.0 kA/m, whereby the cemented carbide is provided with a 10-30 μm essentially cubic carbide phase free and binder phase enriched surface zone with an average binder phase content in a range 1.2-2.5 times a nominal binder phase content, and depositing after post sintering treatments including edge honing the cemented carbide surface a Ti(C,N) layer and optional intermediate layers, if present, by CVD, MTCVD, and combinations thereof and subsequently using a CVD process incorporating several different deposition steps to nucleate α-Al$_2$O$_3$ at a temperature of 1000° C. in a CO$_2$+CO+H$_2$+N$_2$ gas mixture the composition of which is controlled to result in an O-potential required to achieve (006) texture and finally an α-Al$_2$O$_3$-layer by CVD at 1000° C.

4. A method for wet or dry medium-rough to rough turning of stainless steels and superalloys, comprising:

cutting with a cutting tool insert of claim 1 at a cutting speed of 25-180 m/min, a cutting depth 0.5-6.5 mm and a feed of 0.15-0.80 mm/rev.

5. The cutting tool insert of claim 1, wherein said cemented carbide body comprises 8.0-11.0 wt-% Co.

6. The cutting tool insert of claim 1, wherein said cemented carbide body comprises 6.5-9.5 wt-% cubic carbide forming metals selected from group IVb, Vb and VIb of the periodic table.

7. The cutting tool insert of claim 1, wherein said cubic carbide forming metals from group IVb, Vb and VIb of the periodic table is selected from the group consisting of Ti, Nb, Ta, and combinations thereof.

8. The cutting tool insert of claim 1, wherein said weight-ratio of Ta and Nb is between 1.5-2.5.

9. The cutting tool insert of claim 1, wherein said weight-ratio of Ti and Nb is between 0.8-1.2.

10. The cutting tool insert of claim 1, wherein said coercivity (Hc) is 10.5-12.5 kA/m.

11. The cutting tool insert of claim 1, wherein said cemented carbide is provided with a 15-25 μm essentially cubic carbide phase free and binder phase enriched surface zone with average binder phase content in the range 1.2-2.5 times the nominal binder phase content.

12. The cutting tool insert of claim 1, wherein said coating comprising a MTCVD Ti(C,N) as the first layer adjacent the body having a thickness of from 3.5 to 5.0 μm.

13. The cutting tool insert of claim 1, wherein said innermost TiN layer has a thickness below 0.5 μm.

14. The cutting tool insert of claim 1, wherein said intermediate TiN layer on top of the Ti(C,N) layer has a thickness of 0.5-0.8 μm.

15. The cutting tool insert of claim 1, wherein said α-Al$_2$O$_3$ layer has a thickness of between 2.5 and 4.0 μm.

16. The cutting tool insert of claim 1, wherein said total thickness of the coating is between 6.5 and 8.5 μm.

17. The cutting tool insert of claim 1, wherein said texture of the α-Al$_2$O$_3$ layer is TC(006)>3.

18. The cutting tool insert according to claim 1, wherein the surface of α-Al$_2$O$_3$ layer is wet-blasted, with roughness R$_a$=0.5-0.7 μm.

19. The cutting tool insert according to claim 1, wherein a CO$_2$+CO+H$_2$+N$_2$ gas mixture is controlled to result in an O-potential to achieve the (006) texture.

20. A cutting tool insert, comprising a cemented carbide body; and a coating, wherein said cemented carbide body comprises 7.0-11.0 wt-% Co, 5.0-11.0 wt-% cubic carbide forming metals selected from groups IVb, Vb and VIb of the periodic table and balance WC, and with a weight-ratio of Ta and Nb, when present, between 1.0-3.0, and between Ti and Nb, when present, within 0.5-1.5, and with a coercivity (Hc) of 9.0-14.0 kA/m, whereby the cemented carbide is provided with a 10-30 μm, essentially cubic carbide phase free and binder phase enriched surface zone with an average binder phase content in a range 1.2-2.5 times a nominal binder phase content, and wherein said coating comprises a MTCVD Ti(C,N) as a first layer adjacent the body having a thickness of from 2.5 to 7.0 μm, where the MTCVD-layer comprises an innermost TiN layer adjacent to the body with a Ti(C,N) layer on top, optionally with an additional intermediate TiN layer on top of the Ti(C,N) layer, with a thickness of 0.3-1.0 μm, on top of which an α-Al$_2$O$_3$ layer is present, with a thickness of between 2.0 and 5.0 μm, and a total thickness of the coating between 5.5 and 9.5 μm, where a texture of the α-Al$_2$O$_3$ layer is TC(006)>2.0, and where texture coefficients (TC) for the α-Al$_2$O$_3$ layer is determined as follows:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

where
- I(hkl)=intensity of the (hkl) reflection,
- I$_0$(hkl)=standard intensity according to JCPDS card no 46-1212, and
- n=number of reflections used in the calculation, and the (hkl) reflections used are: (012), (104), (110), (006), (113), (202), (024) and (116), where TC(012), TC(110), TC(113), TC(202), TC(024) and TC(116) are all simultaneously <1 and TC(104) is the second highest texture coefficient with TC(104) between 0.5 and 2.0.

* * * * *